(12) United States Patent
Ning

(10) Patent No.: US 11,881,240 B2
(45) Date of Patent: Jan. 23, 2024

(54) SYSTEMS AND METHODS FOR READ/WRITE OF MEMORY DEVICES AND ERROR CORRECTION

(71) Applicant: Changxin Memory Technologies, Inc., Anhui (CN)

(72) Inventor: Shuliang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 164 days.

(21) Appl. No.: 17/396,692

(22) Filed: Aug. 7, 2021

(65) Prior Publication Data

US 2021/0366567 A1 Nov. 25, 2021

Related U.S. Application Data

(63) Continuation of application No. PCT/CN2020/130388, filed on Nov. 20, 2020.

(30) Foreign Application Priority Data

Apr. 1, 2020 (CN) .......................... 202010249668.5

(51) Int. Cl.
*G11C 29/42* (2006.01)
*G11C 11/4096* (2006.01)
(Continued)

(52) U.S. Cl.
CPC .......... *G11C 29/42* (2013.01); *G11C 11/4096* (2013.01); *G11C 29/18* (2013.01);
(Continued)

(58) Field of Classification Search
CPC ..... G11C 29/42; G11C 11/4096; G11C 29/18; G11C 2029/1802; H03K 19/17728
See application file for complete search history.

(56) References Cited

U.S. PATENT DOCUMENTS 5,841,711 A 11/1998 Watanabe
5,996,096 A 11/1999 Dell et al.
(Continued)

FOREIGN PATENT DOCUMENTS

CN 1832049 A 9/2006
CN 101145372 A 3/2008
(Continued)

OTHER PUBLICATIONS

Extended European Search Report dated Oct. 11, 2022, issued in related European Application No. 20929597.1 (7 pages).
(Continued)

*Primary Examiner* — Tuan T Nguyen
(74) *Attorney, Agent, or Firm* — Kilpatrick Townsend & Stockton LLP

(57) ABSTRACT

A read/write method and a memory are provided. The read/write method includes: issuing a read command to a memory, wherein the read command points to an address; reading to-be-read data from a storage unit corresponding to the address to which the read command points; and in response to an error occurring in the to-be-read data, marking the address to which the read command points as disabled. When executing a read/write operation on the memory, the address of the storage unit is marked to distinguish an enabled storage unit from a failed storage unit in real time. A data error or a data loss can be avoided, thereby greatly improving the reliability and the service life of the memory.

12 Claims, 5 Drawing Sheets

(51) Int. Cl.
*G11C 29/18* (2006.01)
*H03K 19/17728* (2020.01)

(52) U.S. Cl.
CPC .......... *H03K 19/17728* (2013.01); *G11C 2029/1802* (2013.01)

(56) References Cited

U.S. PATENT DOCUMENTS

| | | | |
|---|---|---|---|
| 9,037,928 | B2 | 5/2015 | Kleveland et al. |
| 9,741,455 | B1 | 8/2017 | Park |
| 10,643,668 | B1 | 5/2020 | Poudyal et al. |
| 11,527,301 | B2 | 12/2022 | Ning et al. |
| 2002/0097613 | A1 | 7/2002 | Raynham |
| 2002/0169996 | A1 | 11/2002 | King et al. |
| 2003/0133336 | A1 | 7/2003 | Chen |
| 2003/0156469 | A1 | 8/2003 | Viehmann et al. |
| 2004/0003315 | A1 | 1/2004 | Lakhani et al. |
| 2006/0140027 | A1 | 6/2006 | Tominaga |
| 2007/0113155 | A1 | 5/2007 | Takahashi |
| 2007/0294570 | A1 | 12/2007 | Polisetti et al. |
| 2008/0130156 | A1 | 6/2008 | Chu et al. |
| 2008/0181035 | A1* | 7/2008 | Kawasumi ......... G11C 29/4401 365/225.7 |
| 2010/0229033 | A1 | 9/2010 | Maeda et al. |
| 2010/0269000 | A1 | 10/2010 | Lee |
| 2010/0332895 | A1 | 12/2010 | Billing et al. |
| 2010/0332950 | A1 | 12/2010 | Billing et al. |
| 2011/0119558 | A1 | 5/2011 | Koshiyama et al. |
| 2012/0166710 | A1 | 6/2012 | Ou |
| 2012/0254511 | A1 | 10/2012 | Yeh |
| 2013/0179724 | A1 | 7/2013 | Cordero et al. |
| 2014/0013182 | A1 | 1/2014 | Cheng et al. |
| 2014/0075265 | A1* | 3/2014 | Hung ............... G11C 29/44 714/763 |
| 2014/0376320 | A1 | 12/2014 | Loh et al. |
| 2015/0019804 | A1 | 1/2015 | Nemazie et al. |
| 2015/0127972 | A1 | 5/2015 | Chun et al. |
| 2015/0143198 | A1 | 5/2015 | Chun et al. |
| 2015/0186198 | A1 | 7/2015 | Dong et al. |
| 2015/0293809 | A1 | 10/2015 | Liang |
| 2015/0347254 | A1 | 12/2015 | Jones et al. |
| 2015/0363425 | A1 | 12/2015 | Li et al. |
| 2016/0147599 | A1 | 5/2016 | Kim |
| 2016/0357462 | A1 | 12/2016 | Nam et al. |
| 2016/0364153 | A1 | 12/2016 | Nam et al. |
| 2017/0123879 | A1 | 5/2017 | Donlin |
| 2017/0132075 | A1 | 5/2017 | Zastrow et al. |
| 2017/0139839 | A1 | 5/2017 | Ke |
| 2017/0147266 | A1 | 5/2017 | Zhou |
| 2017/0262178 | A1 | 9/2017 | Hashimoto |
| 2017/0308433 | A1 | 10/2017 | Kwon et al. |
| 2017/0329670 | A1 | 11/2017 | Kaminaga |
| 2017/0372799 | A1 | 12/2017 | Bacchus |
| 2018/0052732 | A1 | 2/2018 | Jo et al. |
| 2018/0158535 | A1* | 6/2018 | Kim ............... G11C 29/783 |
| 2019/0129776 | A1 | 5/2019 | Hsiao |
| 2019/0371391 | A1 | 12/2019 | Cha et al. |
| 2019/0377631 | A1 | 12/2019 | Hattori |
| 2019/0385693 | A1 | 12/2019 | Shin et al. |
| 2020/0004652 | A1 | 1/2020 | Niu et al. |
| 2021/0055981 | A1 | 2/2021 | Miller et al. |
| 2021/0311836 | A1 | 10/2021 | Ning et al. |

FOREIGN PATENT DOCUMENTS

| | | |
|---|---|---|
| CN | 101593157 A | 12/2009 |
| CN | 101777013 A | 7/2010 |
| CN | 101908023 A | 12/2010 |
| CN | 101937374 A | 1/2011 |
| CN | 101937725 A | 1/2011 |
| CN | 102063940 A | 5/2011 |
| CN | 102203740 A | 9/2011 |
| CN | 102592680 A | 7/2012 |
| CN | 103019873 A | 4/2013 |
| CN | 103247345 A | 8/2013 |
| CN | 103269230 A | 8/2013 |
| CN | 103309775 A | 9/2013 |
| CN | 103778065 A | 5/2014 |
| CN | 103839591 A | 6/2014 |
| CN | 103955430 A | 7/2014 |
| CN | 103955431 A | 7/2014 |
| CN | 104063186 A | 9/2014 |
| CN | 105740163 A | 7/2016 |
| CN | 105788648 A | 7/2016 |
| CN | 105868122 A | 8/2016 |
| CN | 105893178 A | 8/2016 |
| CN | 106569742 A | 4/2017 |
| CN | 106776362 A | 5/2017 |
| CN | 107247563 A | 10/2017 |
| CN | 107402836 A | 11/2017 |
| CN | 107766173 A | 3/2018 |
| CN | 110673980 A | 1/2020 |
| TW | 201706842 A | 2/2017 |
| WO | 2012019475 A1 | 2/2012 |

OTHER PUBLICATIONS

Extended European Search Report dated Sep. 28, 2022, issued in related European Application No. 20929096.4 (13 pages).
PCT International Search Report and the Written Opinion dated Feb. 23, 2021, issued in related International Application No. PCT/CN2020/130388 (9 pages).
PCT International Search Report dated Feb. 24, 2021, issued in related International Application No. PCT/CN2020/130389, with English translation (7 pages).
PCT International Search Report dated Feb. 24, 2021, issued in related International Application No. PCT/CN2020/130390, with English translation (7 pages).
PCT International Search Report dated Jan. 20, 2021, issued in related International Application No. PCT/CN2020/130391, with English translation (6 pages).
PCT International Search Report dated Feb. 18, 2021, issued in related International Application No. PCT/CN2020/127508, with English translation (7 pages).
PCT International Search Report dated Feb. 7, 2021, issued in related International Application No. PCT/CN2020/127531, with English translation (7 pages).
PCT International Search Report dated Feb. 18, 2021, issued in related International Application No. PCT/CN2020/127584, with English translation (7 pages).
PCT International Search Report dated Feb. 10, 2021, issued in related International Application No. PCT/CN2020/127978, with English translation (7 pages).
PCT International Search Report and the Written Opinion dated Feb. 10, 2021, issued in related International Application No. PCT/CN2020/127978, with partial English translation (9 pages).
Extended European Search Report dated Jun. 13, 2022, issued in related European Application No. 20926376.3 (13 pages).
Extended European Search Report dated Jul. 4, 2022, issued in related European Application No. 20928575.8 (9 pages).
Extended European Search Report dated Jul. 19, 2022, issued in related European Application No. 20928300.1 (12 pages).
Extended European Search Report dated Jun. 2, 2022, issued in related European Application No. 20928031.2 (11 pages).
Non-Final Office Action dated Apr. 26, 2022, issued in related U.S. Appl. No. 17/342,492 (11 pages).
State Intellectual Property Office of the People's Republic of China, First Office Action issued in Application No. 202010250011.0, dated Feb. 15, 2023, 9 pages.
State Intellectual Property Office of the People's Republic of China, First Office Action issued in Application No. 202010250426.8, dated Feb. 16, 2023, 12 pages.
State Intellectual Property Office of the People's Republic of China, First Office Action issued in Application No. 202010249989.5, dated Jan. 19, 2023, 10 pages.
State Intellectual Property Office of the People's Republic of China, First Office Action issued in Application No. 202010250023.3, dated Jan. 19, 2023, 12 pages.

(56) References Cited

OTHER PUBLICATIONS

European Patent Office, Office Action Issued in Application No. 20928300.1, dated Feb. 22, 2023, Germany, 11pages.
Extended European Search Report dated Oct. 11, 2022, issued in related European Application No. 20928574.1 (14 pages).
United States Patent and Trademark Office, Non-Final office action issued in related U.S. Appl. No. 17/363,013 dated Aug. 3, 2023, total 11 pages.
United States Patent and Trademark Office, Non-Final office action issued in related U.S. Appl. No. 17/347,525 dated Aug. 2, 2023, total 9 pages.
United States Patent and Trademark Office, Non-Final office action issued in related U.S. Appl. No. 17/310,495 dated Jul. 31, 2023, total 14 pages.
United States Patent and Trademark Office, Non-Final office action issued in related U.S. Appl. No. 17/342,498 dated Jul. 19, 2023, total 15 pages.
State Intellectual Property Office of the People's Republic of China, Office Action Issued in Application No. 202010250008.9, dated Jul. 1, 8 pages.
European Patent Office, Summons to attend oral proceedings issued in Application No. 20928300.1, Nov. 15, 2023, Germany, 11 pages.

\* cited by examiner

SYSTEMS AND METHODS FOR READ/WRITE OF MEMORY DEVICES AND ERROR CORRECTION

CROSS-REFERENCE TO RELATED APPLICATIONS

This application is a continuation application of International Patent Application No.: PCT/CN2020/130388, filed on Nov. 20, 2020, which claims priority to Chinese Patent Application No.: 202010249668.5, filed on Apr. 1, 2020. The above-referenced applications are incorporated herein by reference in their entirety.

TECHNICAL FIELD

The present invention relates to the field of semiconductor storage, and in particular, to a read/write method and a memory.

BACKGROUND

A semiconductor memory is a memory component configured to store various types of data. As the complexity level of the memory circuits increases, poor or damaged storage units are inevitably produced during the production process or use of the memories, resulting in reduced reliability of the semiconductor memories.

Therefore, there's an urgent need to mitigate the foregoing situation.

SUMMARY

The objective of the present invention is to provide a read/write method and a memory, to significantly improve the reliability and service life of the memory.

One aspect of the present invention is directed to a read/write method. The method may include: issuing a read command to a memory, wherein the read command points to an address; reading to-be-read data from a storage unit corresponding to the address to which the read command points; and if an error occurs in the to-be-read data, marking the address to which the read command points as disabled.

In some embodiments, the read/write method may further include: if no error occurs in the to-be-read data, marking the address to which the read command points as enabled.

In some embodiments, the address that is not marked as disabled may be initially set to enabled.

In some embodiments, the reading to-be-read data from a storage unit corresponding to the address to which the read command points may further include: reading a first Error Correction Code (ECC) corresponding to the to-be-read data from the storage unit corresponding to the address to which the read command points, and a method for determining whether an error occurs in the to-be-read data may include: decoding the first ECC to determine whether an error occurs in the to-be-read data.

In some embodiments, the read/write method may further include: providing a lookup table, wherein the lookup table records the address of the storage unit and an initial mark thereof; and if an error occurs in the to-be-read data, modifying the initial mark of the address to which the read command points to disabled in the lookup table.

In some embodiments, the initial mark may include enabled or disabled.

In some embodiments, the read/write method may further include: issuing a write command to the memory; and if the mark of the address to which the write command points is valid, executing a write operation on the storage unit corresponding to the address to which the write command points; or if the mark of the address to which the write command points is disabled, stopping the write operation on the storage unit corresponding to the address to which the write command points.

In some embodiments, the issuing a write command to the memory may further include: using the address to which the write command points as an index to search for the mark in the lookup table.

In some embodiments, the read/write method may further include: after stopping the write operation on the storage unit corresponding to the address to which the write command points, modifying the address to which the write command points to another address.

In some embodiments, the read/write method may further include: after modifying the address to which the write command points to the other address, determining whether the other address is enabled.

In some embodiments, the executing a write operation on the storage unit corresponding to the address to which the write command points may further include: generating a second ECC corresponding to to-be-written data in the write operation, and writing the second ECC together with the to-be-written data into the storage unit corresponding to the address to which the write command points.

In some embodiments, the read/write method may further include: after issuing the read command to the memory and before reading the to-be-read data from the storage unit corresponding to the address to which the read command points, determining whether the address to which the read command points is enabled; and if the address to which the read command points is enabled, executing a read operation on the storage unit corresponding to the address to which the read command points.

In some embodiments, the read/write method may further include: if the address to which the read command points is disabled, determining whether a write command is executed on the address to which the read command points after the address to which the read command points is marked as disabled; and if it is determined that a write command is executed on the address to which the read command points after the address to which the read command points is marked as disabled, pointing the read command to the address to which the write command points, to execute a read operation on the storage unit corresponding to the address to which the write command points.

Another aspect of the present invention is directed to a memory. The memory may include: a command receiving unit, configured to receive a read command or a write command; a storage unit, corresponding to an address corresponding to the read command or the write command; an execution unit, configured to execute a read operation or a write operation on the storage unit; and a marking unit, configured to store marking information. The marking information may record that the address is enabled or disabled.

In some embodiments, the memory may further include an Error Correction Code (ECC) decoding unit, configured to decode a first ECC corresponding to to-be-read data in the read operation and generate a second ECC corresponding to to-be-written data in the write operation.

In some embodiments, the marking unit may be a lookup table recording the address of the storage unit and an initial mark thereof. If an error occurs in the to-be-read data, the initial mark of the address may be modified to disabled in the lookup table.

In some embodiments, the execution unit may be further connected to the marking unit, and configured to: based on the marking information in the marking unit, execute the read operation or the write operation on the storage unit corresponding to the address, or stop the read operation or the write operation on the storage unit corresponding to the address.

In some embodiments, the memory may further include a conversion unit, configured to: after stopping the read operation or the write operation on the storage unit corresponding to the address, modify the address to which the read command or the write command points to another address.

In some embodiments, the memory may further include a logical layer and at least one storage layer. The command receiving unit, the marking unit, and the execution unit may be disposed at the logical layer, and the storage unit may be disposed at the storage layer.

The present invention has the following advantage: When a user executes a read/write operation on the memory, the address of the storage unit is marked, to distinguish an enabled storage unit from a failed storage unit in real time. That is, each time a read operation is executed, address of a failed storage unit is marked, so that when the user executes a read operation or a write operation on the memory, the user may execute the read/write operation only on an enabled storage unit instead of a failed storage unit. This avoids a data error or a data loss, thereby greatly improving the reliability and the service life of the memory.

DETAILED DESCRIPTION OF THE EMBODIMENTS

The accompanying drawings illustrate embodiments that are in accordance with the present invention, and are used to explain the principles of the present invention. It is apparent that the drawings in the following description are only for some of the embodiments of the present invention, and other drawings may be obtained from those skilled in the art without departing from the drawings. The dimensions in the accompanying drawings are illustrative and may be not to scale.

A common method for improving the reliability of a memory is to encode data into an Error Correction Code ("ECC") before writing the data into the memory, and store both the data and the ECC in the memory. In a read operation, both the data and the ECC are read, and the ECC is decoded to restore the data in which an error may occur.

However, the ECC can only be used to correct the data when the data is read, and the erroneous data still remains in the storage unit of the memory. Assuming that a data error has occurred in a first storage unit, in a subsequent data storage process, if another data error occurs in at least one storage unit in the storage segment corresponding to the first storage unit with the data error, then the storage segment will have at least two storage units with erroneous data. The ECC cannot be used to correct the erroneous data in such a situation. As a result, the storage segment may become disabled, sometimes so does the whole memory, thus affecting the reliability and the service life of the memory.

If a storage unit with a data error can be marked in real time during the use of a memory, it will provide a basis for a subsequent read/write operation, thereby greatly improving the reliability of the memory. Therefore, a read/write method is provided in the present invention, which may mark a storage unit with a data error in real time.

1. The First Embodiment of the Read/Write Method

The present invention first presents a read/write method as the first embodiment. When executing a read operation, the address corresponding to the storage unit in which an error occurs in the to-be-read data may be marked.

Figure 1:
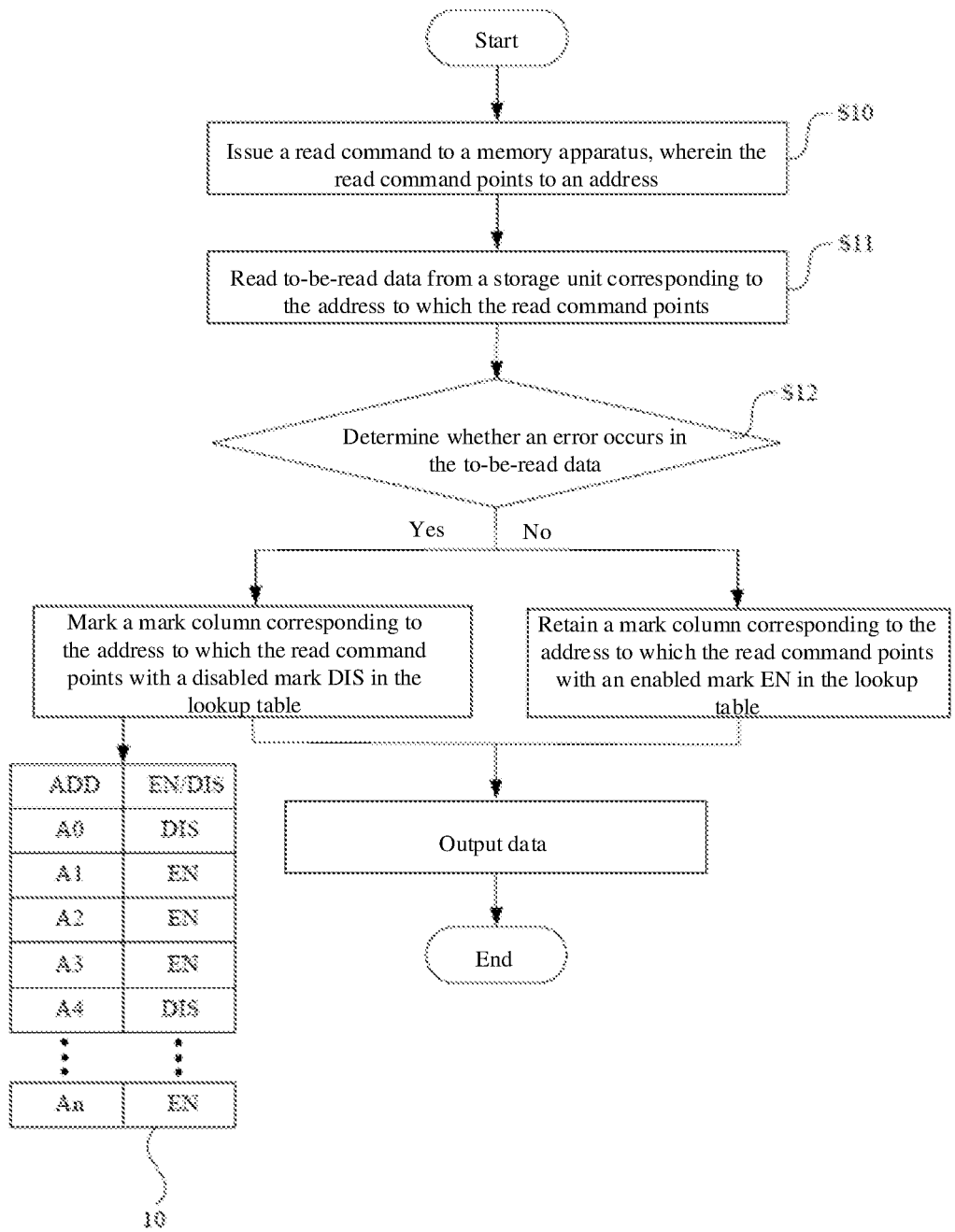
FIG. 1 is a schematic flowchart of a read/write method according to a first embodiment of the present invention.

FIG. 1 is a schematic flowchart of the read/write method according to the first embodiment of the present invention. Referring to FIG. 1, the read/write method may include the following steps.

In Step S10, a read command may be issued to a memory. The read command may point to an address. For example, the address to which the read command points may be A0.

In Step S11, to-be-read data may be read from the storage unit corresponding to the address to which the read command points. For example, the to-be-read data may be read from the storage unit corresponding to the address A0.

In Step S12, it may be determined whether an error occurs in the to-be-read data. If an error occurs in the to-be-read data, which indicates that the storage unit fails, the address to which the read command points may be marked as disabled.

In this first embodiment of the read/write method, a lookup table 10 may be provided, and an address column ADD and a mark column EN/DIS may be set in the lookup table 10. The address column ADD may pre-store all the addresses of the memory, for example, A0, A1, A2, A3, A4, A5, A6, . . . and An. The number of pieces of address may be set based on actual needs of the memory and is not limited in this invention. The mark column EN/DIS may be used to store the mark of the address. The mark may include a disabled mark DIS identifying that the address is disabled, or an enabled mark EN identifying that the address is enabled. The disabled mark DIS and the enabled mark EN may be represented by a binary code (for example, if the binary code has 1 bit, 1 may represent the enabled mark EN, while 0 may represent the disabled mark DIS), which is not limited in the present invention. Each piece of address may correspond to one mark.

Specifically, if an error occurs in the to-be-read data read from the storage unit corresponding to the address A0 to which the read command points, the mark column corresponding to the address A0 to which the read command points may be marked with the disabled mark DIS in the lookup table 10; or if an error occurs in the to-be-read data read from the storage unit corresponding to the address A4 to which the read command points, the mark column corresponding to the address A4 to which the read command points may be marked with the disabled mark DIS in the lookup table 10.

If no error occurs in the to-be-read data, which indicates that the storage unit is enabled, the following two processing modes may be adopted.

In the first processing mode, if no error occurs in the to-be-read data, the address to which the read command points may be marked with an enabled mark EN in the lookup table 10. For example, if no error occurs in the to-be-read data read from the storage unit corresponding to the address A1 to which the read command points, the mark column corresponding to the address A1 to which the read command points may be marked with the enabled mark EN in the lookup table 10.

In the second processing mode, all the mark columns corresponding to all the addresses may be initially set to enabled marks EN in the lookup table 10. In this case, if no error occurs in the to-be-read data, the mark of a mark column in the lookup table 10 may not be modified, that is, the initial setting of the mark column is retained. For example, if no error occurs in to-be-read data read from the storage unit corresponding to the address A1 to which the read command points, the mark column corresponding to the address A1 to which the read command points may be retained as the enabled mark EN in the lookup table 10, that is, the initial setting of the mark column may not be modified. The second processing mode may be adopted in this first embodiment of the read/write method.

In the second processing mode, only when an error occurs in the to-be-read data read from the storage unit corresponding to the address to which the read command points, the enabled mark EN of the mark column corresponding to the address to which the read command points may be modified to a disabled mark DIS in the lookup table 10. For example, if an error occurs in the to-be-read data read from the storage unit corresponding to the address A0 to which the read command points, the enabled mark EN of the mark column corresponding to the address A0 to which the read command points may be modified to a disabled mark DIS in the lookup table 10.

In the second processing mode, when the memory is powered on or leaves the factory, all the mark columns corresponding to all the addresses may be initially set to enabled marks EN in the lookup table 10. During the use of the memory and after executing a read/write operation on the memory for multiple times, the mark column corresponding to the address may be marked with a disabled mark DIS or an enabled mark EN in the lookup table 10. Therefore, when issuing the read command to the memory, the lookup table obtained after executing a previous read/write operation may serve as the initial lookup table for the current read operation. Such an initial lookup table may record the mark of the address of the storage unit which is obtained after the previous read/write operation, the mark may serve as the initial mark of the current read operation which may be a disabled mark DIS or an enabled mark EN. If an error occurs in the to-be-read data, the initial mark of the address to which the read command points may be modified to a disabled mark DIS in the lookup table.

A method for determining whether an error occurs in the to-be-read data is further provided in the present invention. Specifically, the reading to-be-read data from a storage unit corresponding to the address to which the read command points may further include: reading a first ECC corresponding to the to-be-read data from the storage unit corresponding to the address to which the read command points. For example, the bit quantity of data read from the storage unit corresponding to the address to which the read command points may be 64b+8b, wherein 64b may be the bit quantity of the to-be-read data, and 8b may be the bit quantity of the first ECC. The first ECC may be decoded according to relevant algorithms, to restore the data in which an error may occur. The algorithms may be in the prior art, and the details of which are not described herein. By decoding the first ECC, it may be determined whether an error occurs in the to-be-read data.

A method for determining whether an error occurs in the to-be-read data, by decoding the first ECC, is further provided in the present invention. The method may include: re-encoding the to-be-read data to generate a new ECC; executing bitwise exclusive-OR comparison between the new ECC and the first ECC; and if bitwise consistency is obtained, which indicates that no error occurs in the to-be-read data and the storage unit is enabled, skipping the modification on the lookup table 10, wherein the mark of the address corresponding to the storage unit is an enabled mark EN; or if the new ECC is inconsistent with the first ECC, which indicates that an error occurs in the to-be-read data and the storage unit is disabled, marking the address to which the read command points as a disabled mark DIS in the lookup table 10.

If no error occurs in the to-be-read data, the to-be-read data may serve as the output data of the memory; or if an error occurs in the to-be-read data, the to-be-read data may be restored by using the first ECC, and the restored data may serve as the output data of the memory.

The read/write method provided in the present invention allows the marking of the address of the storage unit, when executing a read/write operation on the memory, to distinguish an enabled storage unit from a failed storage unit in real time. That is, when executing a read operation on the memory for each time, the address of a failed storage unit may be marked, so that a read/write operation may be executed only on an enabled storage unit instead of a failed storage unit. A data error or a data loss may be avoided, thereby greatly improving the reliability of the memory.

2. The Second Embodiment of the Read/Write Method

Figure 2:
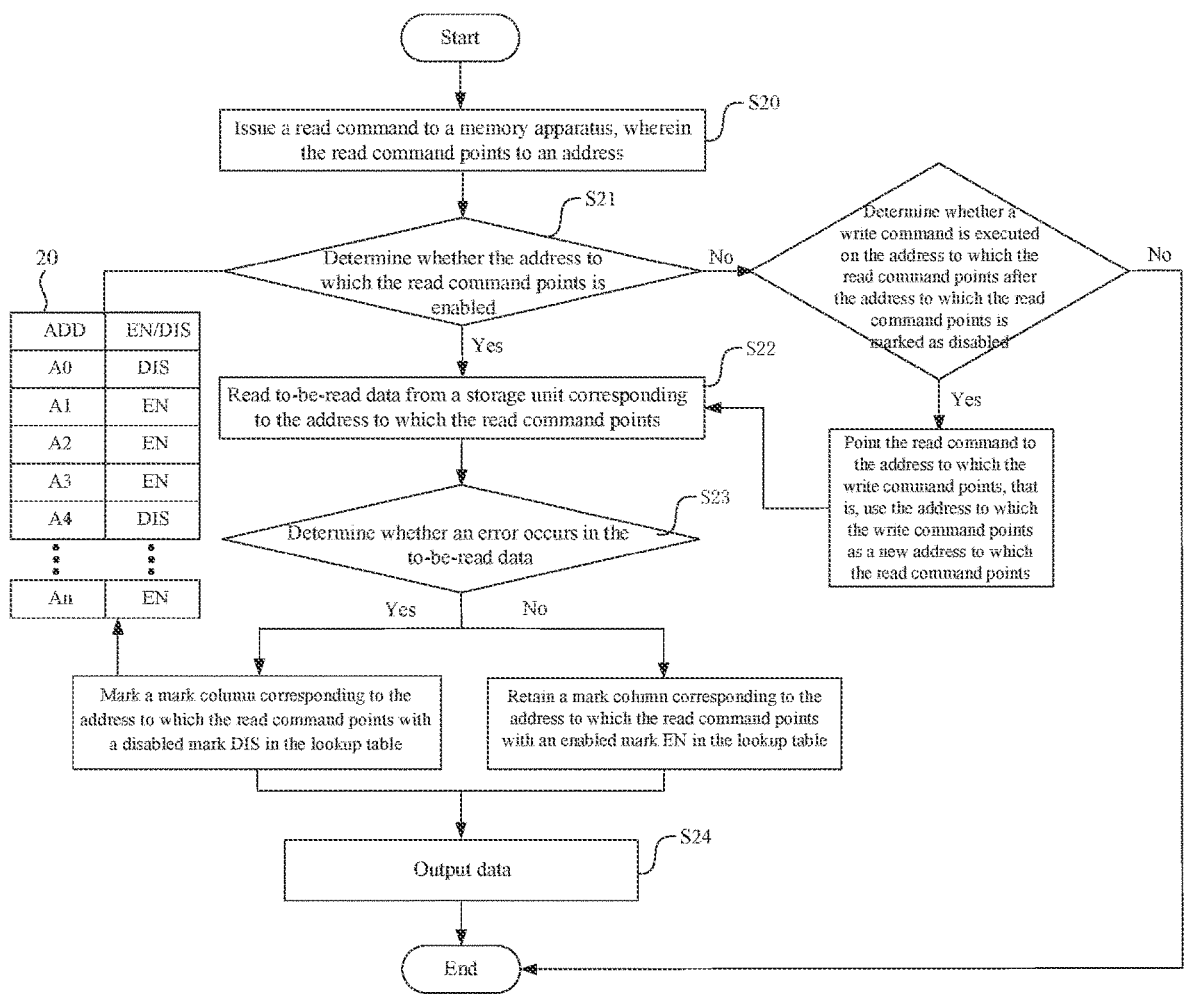
FIG. 2 is a schematic flowchart of a read/write method according to a second embodiment of the present invention.

The present invention further provides a read/write method as the second embodiment. The read/write method may further include: after issuing the read command to the memory and before reading the to-be-read data from the storage unit corresponding to the address to which the read command points, determining whether the address to which the read command points is enabled. FIG. 2 is a schematic flowchart of the read/write method according to the second embodiment of the present invention. Referring to FIG. 2, the read/write method may include the following steps.

In Step S20, a read command may be issued to a memory. The read command may point to an address.

In Step S21, it may be determined whether the address to which the read command points is enabled.

Specifically, when issuing the read command to the memory, the address to which the read command points may be used as an index to search for the mark in the lookup table. In the lookup table, if the mark of the mark column corresponding to the address to which the read command points is an enabled mark EN, it may indicate that the address to which the read command points is enabled; or if the mark of the mark column corresponding to the address to which the read command points is a disabled mark DIS, it may indicate that the address to which the read command points is disabled.

For example, if the address to which the read command points is A1, the address A1 to which the read command points may be used as an index to search for the mark in the lookup table 20. In the lookup table 20, if the mark of the mark column corresponding to the address A1 to which the read command points is an enabled mark EN, it may indicate that the address A1 to which the read command points is enabled.

For another example, if the address to which the read command points is A4, the address A4 to which the read command points may be used as an index to search for the mark in the lookup table 20. In the lookup table 20, if the mark of the mark column corresponding to the address A4 to which the read command points is a disabled mark DIS, it may indicate that the address A4 to which the read command points is disabled.

If the address to which the read command points is enabled, a read operation may be executed on the storage unit corresponding to the address to which the read command points, that is, Step S22 may be executed. For example, in the lookup table 20, if the mark of the mark column corresponding to the address A1 to which the read command points is an enabled mark EN, it may indicate that the storage unit corresponding to the address A1 to which the read command points is enabled. In this case, a read operation may be executed on the storage unit corresponding to the address A1 to which the read command points, that is, Step S22 may be executed. In Step S22, the address to which the read command points may be the address A1.

If the address to which the read command points is disabled, that is, the mark column corresponding to the address to which the read command points is marked with a disabled mark DIS in the lookup table 20, it may indicate that the storage unit corresponding to the address to which the read command points fails. It may be determined whether a write command is executed on the address to which the read command points after the mark column corresponding to the address to which the read command points is marked with a disabled mark DIS in the previous operation of the current read operation. If it is determined that a write command is executed on the address to which the read command points after the mark column corresponding to the address to which the read command points is marked with a disabled mark DIS in the previous operation of the current read operation, the read command may be pointed to the address to which the write command points, that is, the address to which the write command points may be used as the new address to which the read command points, and Step S22 may be executed on the new address. If it is determined that no write command is executed on the address to which the read command points after the mark column corresponding to the address to which the read command points is marked with a disabled mark DIS in the previous operation of the current read operation, two processing modes may be adopted. One processing mode may be to stop the read operation, as shown in FIG. 2. The other processing mode may be to continue the read operation and use the data restored by using the first ECC as the output data of the memory.

For example, in the lookup table 20, if the mark column corresponding to the address A4 to which the read command points is marked with a disabled mark DIS, it may be determined whether a write command is executed on the address A4 to which the read command points after the mark column corresponding to the address A4 to which the read command points is marked with a disabled mark DIS in the previous operation of the current read operation. If it is determined that a write command is executed on the address A4 to which the read command points after the mark column corresponding to the address A4 to which the read command points is marked with a disabled mark DIS in the previous operation of the current read operation, and the write command points to another address A1, the read command may be pointed to the address A1 to which the write command points to execute a read operation on the storage unit corresponding to the address A1, that is, Step S22 may be executed. In Step S22, the address to which the read command points may be the address A1. The third embodiment of the read/write method may be referred to for the implementation of the write command. If it is determined that no write command is executed on the address A4 to which the read command points after the mark column corresponding to the address A4 to which the read command points is marked with a disabled mark DIS in the previous operation of the current read operation, the read operation may be stopped.

In Step S22, to-be-read data may be read from the storage unit corresponding to the address to which the read command points. For example, the to-be-read data may be read from the storage unit corresponding to the address A1 to which the read command points. This step may be the same as Step S11 in the first embodiment of the read/write method.

In Step S23, it may be determined whether an error occurs in the to-be-read data. This step may be the same as Step S12 in the first embodiment of the read/write method. If an error occurs in the to-be-read data, the mark column corresponding to the address to which the read command points may be marked with a disabled mark DIS in the lookup table 20. If no error occurs in the to-be-read data, the mark column corresponding to the address to which the read command points may be marked with an enabled mark EN in the lookup table 20, or the lookup table 20 may not be modified, when all the mark columns in the lookup table 20 are initially set to enabled marks EN.

In Step S24, data may be outputted.

In this second embodiment of the read/write method, after issuing the read command to the memory, whether the address to which the read command points is enabled may be determined to selectively execute the read command on the address to which the read command points, thereby improving the reliability of the memory. Additionally, after reading the to-be-read data, the address of the storage unit may be marked based on whether an error occurs in the to-be-read data, so as to provide a basis of determination for a subsequent read/write operation.

3. The Third Embodiment of the Read/Write Method

Figure 3:
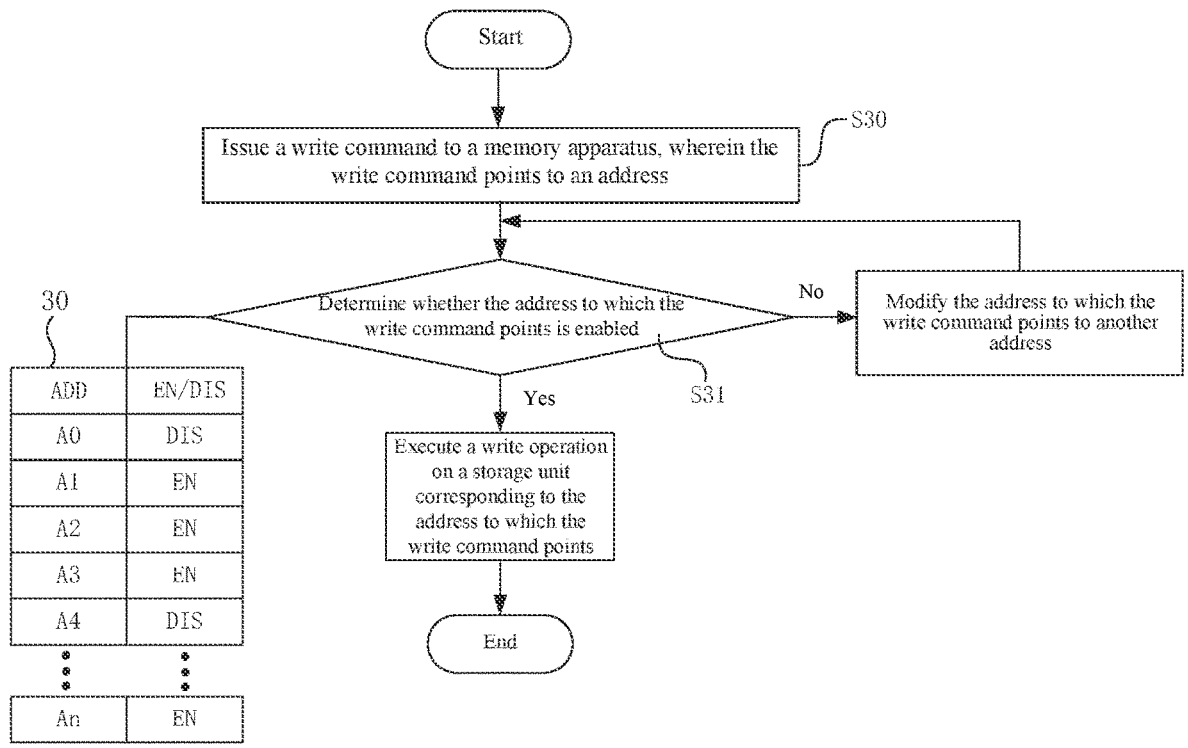
FIG. 3 is a schematic flowchart of a read/write method according to a third embodiment of the present invention.

The present invention further provides a read/write method as the third embodiment. The third embodiment is directed to the execution of a write operation on a memory. FIG. 3 is a schematic flowchart of the read/write method according to the third embodiment of the present invention. Referring to FIG. 3, the read/write method may include the following steps.

In Step S30, a write command may be issued to the memory. The write command may point to an address. For example, a write command may be issued to the memory, and the write command may point to the address A0.

In Step S31, it may be determined whether the mark of the address to which the write command points is enabled.

In this third embodiment of the read/write method, the address to which the write command points may be used as an index to search for the mark corresponding to the address in the lookup table 30 to determine, based on the mark, whether the address to which the write command points is enabled.

For example, if the address to which the write command points is A0, the address A0 to which the write command points may be used as an index to search for the mark of a mark column corresponding to the address A0 in the lookup table 30 to determine, based on the mark, whether the address A0 to which the write command points is enabled. If the address to which the write command points is A1, the address A1 to which the write command points may be used as an index to search for the mark of a mark column corresponding to the address A1 in the lookup table 30 to determine, based on the mark, whether the address A1 to which the write command points is enabled.

If the mark of the address to which the write command points is enabled, a write operation may be executed on the storage unit corresponding to the address to which the write command points. If the mark of the address to which the write command points is disabled, the write operation on the storage unit corresponding to the address to which the write command points may be stopped. For example, if the mark of the mark column corresponding to the address A0 to which the write command points is a disabled mark DIS in the lookup table 30, the write operation on the storage unit corresponding to the address A0 to which the write command points may be stopped. If the mark of the mark column corresponding to the address A1 to which the write command points is an enabled mark EN in the lookup table 30, a write operation may be executed on the storage unit corresponding to the address A1 to which the write command points.

The read/write method may further include: after stopping the write operation on the storage unit corresponding to the address to which the write command points, modifying the address to which the write command points to the other address. After this step, it may be further determined whether the other address is enabled. The determining method may be the same as Step S31. If the mark of the other address is an enabled mark EN, a write operation may be executed on the storage unit corresponding to the other address. If the mark of the other address is a disabled mark, the write operation on the storage unit corresponding to the other address may be stopped, and the address to which the write command points may be further modified to some other address.

For example, after stopping the write operation on the storage unit corresponding to the address A0 to which the write command points, the address A0 to which the write command points may be modified to the other address A1, that is, the write command may point to the address A1. Further, it may be determined whether the address A1 to which the write command points is enabled, that is, it may be determined whether the mark of the address A1 is enabled. For example, in this third embodiment of the read/write method, if the mark of the mark column corresponding to the address A1 is an enabled mark EN, a write operation may be executed on the storage unit corresponding to the address A1. In some other embodiments, if the mark of the mark column corresponding to the address A1 is a disabled mark DIS, the write operation on the storage unit corresponding to the address A1 may be stopped, and the address of the write command may be modified to A2. Then it may be further determined whether the address A2 is enabled. The foregoing operation may be repeated until the mark of the address to which the write command points is an enabled mark EN.

The read/write method may further include: generating a second ECC corresponding to to-be-written data in the write operation, and writing the second ECC together with the to-be-written data into the storage unit corresponding to the address to which the write command points. When reading the data in the storage unit, both the data and the second ECC may be read, and the second ECC may be decoded to restore the data in which an error may occur.

In this third embodiment, after issuing the write command to the memory, it may be determined whether the address to which the write command points is enabled, so as to serve as a basis for whether to execute a write operation on the storage unit. By doing so, a write operation on a failed storage unit may be avoided, thereby improving the reliability of the memory and prolonging the service life of the memory.

A memory that can implement the foregoing read/write method is further provided in the present invention. The memory may include but is not limited to a volatile memory such as DRAM or SRAM, and a non-volatile memory such as NAND, NOR, FeRAM, RRAM, MRAM, or PCRAM.

4. The First Embodiment of the Memory

Figure 4:
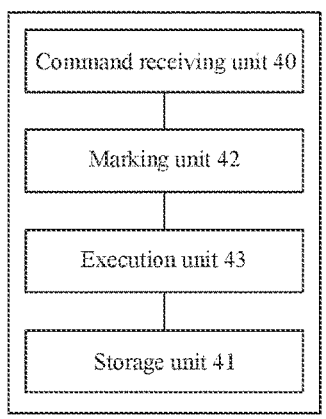
FIG. 4 is a schematic framework diagram of a memory according to a first embodiment of the present invention.

The present invention provides a memory as the first embodiment. FIG. 4 is a schematic framework diagram of the memory according to the first embodiment of the present invention. Referring to FIG. 4, the memory may include a command receiving unit 40, a storage unit 41, a marking unit 42, and an execution unit 43.

The command receiving unit 40 may be configured to receive address to which a read command, a write command, or a read/write command issued to the memory points.

The storage unit 41 may correspond to the address corresponding to the read command or the write command, and may be configured to store data. The storage unit 41 may be a storage unit familiar to a person skilled in the art, such as a storage cell, a storage segment, a storage page, or a storage block, which is not limited in the present invention.

The marking unit 42 may be configured to store marking information. The marking information may record that the address is enabled or disabled. In this first embodiment of the memory, the marking unit 42 may be a lookup table, and the lookup table may record the address of the storage unit 41 and the initial mark thereof. The initial mark may be an enabled mark EN. If an error occurs in the to-be-read data, the initial mark of the address may be modified to disabled in the lookup table; or if no error occurs in the to-be-read data, the initial mark may be retained. In some other embodiments, the mark corresponding to the address may not be initially set to enabled in the lookup table, and if an error occurs in the to-be-read data, the address may be marked as disabled in the lookup table; or if no error occurs in the to-be-read data, the address may be marked as enabled in the lookup table.

The execution unit 43 may be configured to control the execution of a read operation or a write operation on the storage unit 41. The execution unit 43 may be further connected to the marking unit 42, and may be configured to: based on the marking information in the marking unit 42, execute the read operation or the write operation on the storage unit corresponding to the address, or stop the read operation or the write operation on the storage unit corresponding to the address. Specifically, if the marking information corresponding to the address to which the read command or the write command points is an enabled mark EN, the execution unit 43 may execute the read operation or the write operation on the storage unit corresponding to the address; or if the marking information corresponding to the address to which the read command or the write command points is a disabled mark, the execution unit 43 may stop the read operation or the write operation on the storage unit corresponding to the address.

In some other embodiments, the marking unit 42 may be connected only to the execution unit 43, and the command receiving unit 40 may be directly connected to the execution unit 43. The connection mode is not limited in the present invention, and a person of ordinary skills in the art may set the connection mode based on actual needs.

5. The Second Embodiment of the Memory

Figure 5:
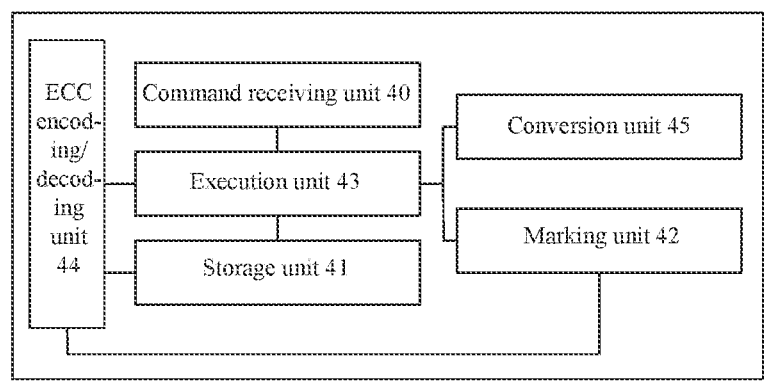
FIG. 5 is a schematic framework diagram of a memory according to a second embodiment of the present invention.

The present invention further provides a memory as the second embodiment. FIG. 5 is a schematic framework diagram of the memory according to the second embodiment of the present invention. The difference between the second embodiment and the first embodiment of the memory lies in that the memory may further include an ECC encoding/decoding unit 44.

The ECC encoding/decoding unit 44 may be connected to the execution unit 43, the storage unit 41, and the marking unit 42.

The ECC encoding/decoding unit 44 may be configured to decode the first ECC corresponding to the to-be-read data in a read operation, to restore data in which an error may occur, and to modify the marking information in the marking unit 42 based on whether the ECC encoding/decoding unit 44 recovers the data. The ECC encoding/decoding unit 44 may be further configured to generate the second ECC corresponding to the to-be-written data in a write operation.

In this second embodiment of the memory, the command receiving unit 40 may receive a write command. When executing a write operation on the storage unit corresponding to the address to which the write command points, the ECC encoding/decoding unit 44 may generate an ECC corresponding to the to-be-written data in the write operation, and store the ECC in the storage unit 41 corresponding to the address to which the write command points. After the write operation is completed, when executing a read operation subsequently on the storage unit corresponding to the address, the ECC encoding/decoding unit 44 may decode the ECC. It may be determined, based on the decoding of the ECC encoding/decoding unit 44, whether an error occurs in the to-be-read data read in the read operation. Then the marking information in the marking unit 42 may be modified.

The marking information in the marking unit 42 may be modified based on whether the ECC encoding/decoding unit 44 restores the data. Specifically, if the ECC encoding/decoding unit 44 decodes the ECC and restores the data, which indicates that an error occurs in the to-be-read data read in the read operation, the address of the storage unit may be marked with a disabled mark DIS in the marking unit 42. If the ECC encoding/decoding unit 44 decodes the ECC but does not restore the data, which indicates that no error occurs in the to-be-read data read in the read operation, the mark of the address may be modified to an enabled mark EN in the marking unit 42, or an initial mark of the address may be retained.

In some other embodiments, although the ECC encoding/decoding unit 44 does not restore the data after decoding the ECC, it may be determined, based on the decoding of the ECC encoding/decoding unit 44, that an error occurs in the to-be-read data read in the read operation. In this case, the address of the storage unit may be marked with a disabled mark DIS in the marking unit 42.

The memory may further include a conversion unit 45. The conversion unit 45 may be connected to the execution unit 43. After stopping the read operation or the write operation on the storage unit corresponding to the address, the conversion unit 45 may modify the address to which the read command or the write command points to the other address. The execution unit 43 may further execute a read operation or a write operation on the other address based on the marking information in the marking unit 42.

In this second embodiment of the memory, the execution unit 43 may not only be connected to the ECC encoding/decoding unit 44, but also connected to the storage unit 41.

6. The Third Embodiment of the Memory

Figure 6:
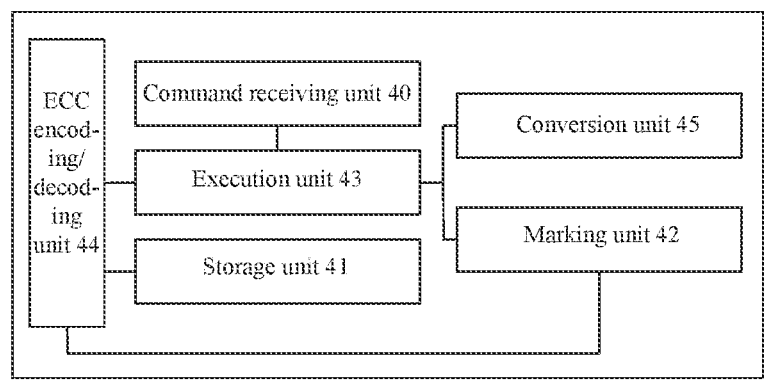
FIG. 6 is a schematic framework diagram of a memory according to a third embodiment of the present invention.

The present invention further provides a memory as the third embodiment. FIG. 6 is a schematic framework diagram of the memory according to the third embodiment of the present invention. Referring to FIG. 6, the execution unit 43 may be connected to the ECC encoding/decoding unit 44, and the ECC encoding/decoding unit 44 may be further connected to the storage unit 41. The connection mode is not limited in the present invention, and a person of ordinary skills in the art may set the connection mode based on actual needs.

7. The Fourth Embodiment of the Memory

Figure 7:
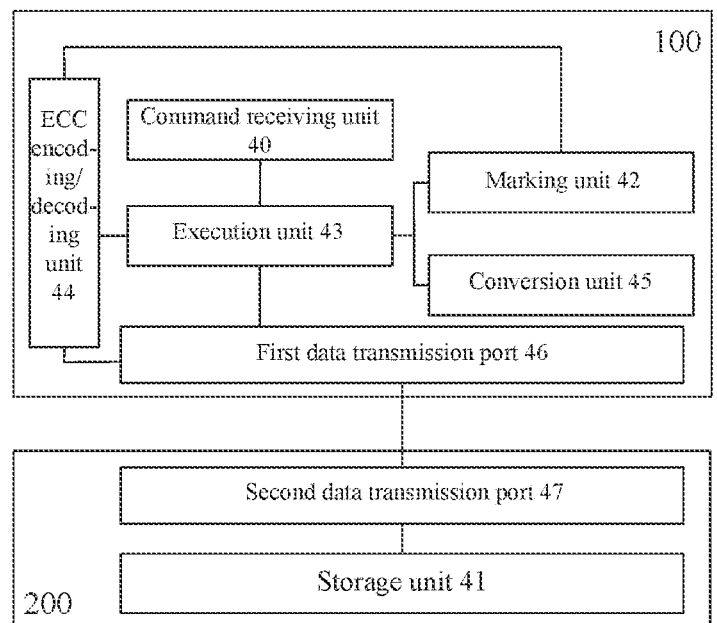
FIG. 7 is a schematic framework diagram of a memory according to a fourth embodiment of the present invention.

The present invention further provides a memory as the fourth embodiment. FIG. 7 is a schematic framework diagram of the memory according to the fourth embodiment of the present invention. Referring to FIG. 7, in comparison with the second embodiment, the memory in this fourth embodiment may include a logical layer 100 and several storage layers 200. Although only one storage layer 200 is shown in FIG. 7, the number of which is not limited in the present invention and may be set based on actual needs. The storage layer 200 may be a DRAM chip, and the logical layer 100 may be a layer having a logical circuit, such as a control chip or an intermediate layer. The several storage layers 200 may be vertically stacked above or below the logical layer 100, or the several storage layers 200 and the logical layer 100 may be integrated together in other encapsulation modes, which is not limited in the present invention.

The command receiving unit 40, the marking unit 42, the execution unit 43, the ECC encoding/decoding unit 44, and the conversion unit 45 may all be disposed at the logical layer 100, and the storage unit 41 may be disposed at the storage layer 200. In some other embodiments, the marking unit 42 and the ECC encoding/decoding unit 44 may alternatively be disposed at the storage layer 200.

In this fourth embodiment of the memory, the logical layer 100 may have at least one first data transmission port 46, and the storage layer 200 may have at least one second data transmission port 47. Instructions and data may be transmitted between the logical layer 100 and the storage layer 200 via the first data transmission port 46 and the second data transmission port 47.

Further, the execution unit 43 may not only be connected to the ECC encoding/decoding unit 44, but also connected to the storage unit 41 via the first data transmission port 46 and the second data transmission port 47.

8. The Fifth Embodiment of the Memory

Figure 8:
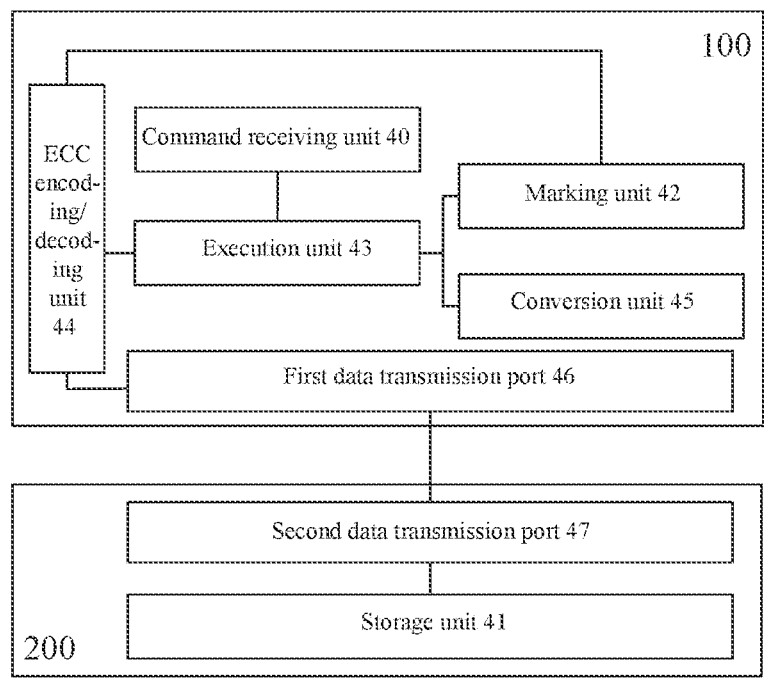
FIG. 8 is a schematic framework diagram of a memory according to a fifth embodiment of the present invention.

The present invention further provides a memory as the fifth embodiment. FIG. 8 is a schematic framework diagram of the memory according to the fifth embodiment of the present invention. Referring to FIG. 8, the execution unit 43 may be connected to the ECC encoding/decoding unit 44, and the ECC encoding/decoding unit 44 may be further connected to the storage unit 41 via the first data transmission port 46 and the second data transmission port 47. The connection mode is not limited in the present invention, and a person of ordinary skills in the art may set the connection mode based on actual needs.

The memory provided in the present invention may mark a failed storage unit during a process of use, to selectively execute a read/write operation on the storage unit, thereby greatly improving the reliability and the service life of the memory.

The foregoing descriptions are merely some embodiments of the present invention. A person of ordinary skills in the art may further make several improvements or modifications without departing from the principle of the present invention, and the improvements or modifications shall fall within the protection scope of the present invention.

What is claimed is:

1. A read/write method applied to a memory, comprising:
   receiving a read command, wherein the read command points to an address;
   reading to-be-read data from a storage unit corresponding to the address to which the read command points;
   in response to an error occurring in the to-be-read data, marking the address to which the read command points as disabled;
   after issuing the read command to the memory and before reading the to-be-read data from the storage unit corresponding to the address to which the read command points, determining whether the address to which the read command points is enabled; and in response to the address to which the read command points being enabled, executing a read operation on the storage unit corresponding to the address to which the read command points.

2. The read/write method according to claim 1, further comprising:
   in response to no error occurring in the to-be-read data, marking the address to which the read command points as enabled.

3. The read/write method according to claim 1, wherein the address that is not marked as disabled is initially set to enabled.

4. The read/write method according to claim 3, wherein the reading to-be-read data from a storage unit corresponding to the address to which the read command points further comprises: reading a first Error Correction Code (ECC) corresponding to the to-be-read data from the storage unit corresponding to the address to which the read command points, and
   wherein the method for determining whether an error occurs in the to-be-read data comprises: decoding the first ECC to determine whether an error occurs in the to-be-read data.

5. The read/write method according to claim 4, further comprising:
   providing a lookup table, wherein the lookup table records the address of the storage unit and an initial mark thereof; and
   in response to the error occurring in the to-be-read data, modifying the initial mark of the address to which the read command points to disabled in the lookup table.

6. The read/write method according to claim 5, wherein the initial mark comprises enabled or disabled.

7. The read/write method according to claim 5, further comprising:
   issuing a write command to the memory; and
   in response to a mark of the address to which the write command points being enabled, executing a write operation on the storage unit corresponding to the address to which the write command points; or
   in response to the mark of the address to which the write command points being disabled, stopping the write operation on the storage unit corresponding to the address to which the write command points.

8. The read/write method according to claim 7, wherein issuing a write command to the memory further comprises: using the address to which the write command points as an index to search for the mark in the lookup table.

9. The read/write method according to claim 7, further comprising:
   after stopping the write operation on the storage unit corresponding to the address to which the write command points, modifying the address to which the write command points to another address.

10. The read/write method according to claim 9, further comprising:
    after modifying the address to which the write command points to the other address, determining whether the other address is enabled.

11. The read/write method according to claim 7, wherein the executing a write operation on the storage unit corresponding to the address to which the write command points further comprises:
    generating a second ECC corresponding to to-be-written data in the write operation, and writing the second ECC together with the to-be-written data into the storage unit corresponding to the address to which the write command points.

12. The read/write method according to claim 7, further comprising:
    in response to the address to which the read command points being disabled, determining whether the write command is executed on the address to which the read command points after the address to which the read command points is marked as disabled; and
    in response to a determination that the write command is executed on the address to which the read command points after the address to which the read command points is marked as disabled, pointing the read command to the address to which the write command points, to execute the read operation on the storage unit corresponding to the address to which the write command points.

* * * * *